United States Patent
Shimizu et al.

(10) Patent No.: US 9,300,114 B2
(45) Date of Patent: Mar. 29, 2016

(54) LASER DEVICE, METHOD OF MANUFACTURING THE SAME, LASER DEVICE ARRAY, LIGHT SOURCE AND LIGHT MODULE

(75) Inventors: Hitoshi Shimizu, Chiba (JP); Toshihito Suzuki, Chiba (JP); Yasumasa Kawakita, Chiba (JP); Keishi Takaki, Chiba (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 820 days.

(21) Appl. No.: 13/435,061

(22) Filed: Mar. 30, 2012

(65) Prior Publication Data

US 2012/0251039 A1    Oct. 4, 2012

(30) Foreign Application Priority Data

Mar. 31, 2011   (JP) ................................. 2011-080571

(51) Int. Cl.
| | |
|---|---|
| G02B 6/12 | (2006.01) |
| H01S 5/183 | (2006.01) |
| B82Y 20/00 | (2011.01) |
| H01S 5/00 | (2006.01) |
| H01S 5/343 | (2006.01) |
| H01S 5/42 | (2006.01) |

(52) U.S. Cl.
CPC ............ H01S 5/18311 (2013.01); B82Y 20/00 (2013.01); H01S 5/0021 (2013.01); H01S 5/18333 (2013.01); H01S 5/18358 (2013.01); H01S 5/34306 (2013.01); H01S 5/423 (2013.01); H01S 2301/176 (2013.01)

(58) Field of Classification Search
None
See application file for complete search history.

(56) References Cited

U.S. PATENT DOCUMENTS

| | | | | |
|---|---|---|---|---|
| 6,056,448 | A | * | 5/2000 | Sauter et al. .................... 385/92 |
| 6,317,446 | B1 | * | 11/2001 | Wipiejewski .............. 372/46.01 |
| 2009/0262765 | A1 | * | 10/2009 | Chang et al. .................... 372/26 |

FOREIGN PATENT DOCUMENTS

| | | |
|---|---|---|
| JP | 200022204 A | 1/2000 |
| JP | 2001160658 A | 6/2001 |
| JP | 200431863 A | 1/2004 |
| JP | 2004356438 A | 12/2004 |
| JP | 2008210991 A | 9/2008 |
| JP | 2009206480 A | 9/2009 |

OTHER PUBLICATIONS

E. R. Hegblom et al., "High-Performance Small Vertical-Cavity Lasers: A Comparison of Measured Improvements in Optical and Current Confinement in Devices Using Tapered Apertures", Journal of Selected Topics in Quantum Electronics, vol. 5, No. 3, p. 553-560, May/Jun. 1999.
Office Action mailed Jun. 3, 2014, corresponds to Japanese patent application No. 2011-080571.

* cited by examiner (Continued)

*Primary Examiner* — Uyen Chau N Le
*Assistant Examiner* — Chad Smith
(74) *Attorney, Agent, or Firm* — Hauptman Ham, LLP

(57) ABSTRACT

Provided is a laser device comprising a substrate, an active layer, and a current confinement layer. The current confinement layer includes an oxide layer that is formed extending from a edge of the current confinement layer in a parallel plane parallel to a surface of the substrate, toward a center of the current confinement layer along the parallel plane, and that does not have an inflection point between the edge and a tip portion formed closer to the center or has a plurality of inflection points formed between the edge and the tip portion.

20 Claims, 14 Drawing Sheets

LASER DEVICE, METHOD OF MANUFACTURING THE SAME, LASER DEVICE ARRAY, LIGHT SOURCE AND LIGHT MODULE

The contents of the following Japanese patent application are incorporated herein by reference: NO. 2011-080571 filed on Mar. 31, 2011.

BACKGROUND

1. Technical Field

The present invention relates to a laser device, a laser device manufacturing method, a laser device array, a light source, and a light module.

2. Related Art

An oxide layer formed by selectively oxidizing a semiconductor layer containing Al has been conventionally used as a current confinement layer for confining current flowing through an active layer of a surface emitting laser device. In order for the surface emitting laser device to operate at high speed, it is necessary to decrease the capacitance of the oxide layer. The capacitance of the oxide layer is inversely proportional to the thickness of the oxide layer. To achieve this, a method that increases thickness of the insulating layer by implanting ions in the periphery of the oxide layer and a method that increases thickness by forming a tapered oxide layer have been proposed, as shown in Patent Document 1 and Non-Patent Document 1, for example.

Patent Document 1: US patent Application No. 2009/0262765

Non-patent Document 1: Journal of Selected Topics in Quantum Electronics vol. 5, p 553, 1999

However, the ion implantation method is a complex process, and is therefore bad for manufacturing yield. Furthermore, an oxide layer with a tapered shape includes an inflection point at which the slope changes non-continuously at an interface between the tapered portion and the flat portion, and therefore the oxide layer is easily broken due to thermal stress being focused at the inflection point.

SUMMARY

Therefore, it is an object of an aspect of the innovations herein to provide a laser device, a laser device manufacturing method, a laser device array, a light source, and a light module, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a laser device that outputs laser light, comprising a substrate; an active layer formed above the substrate; and a current confinement layer that confines current flowing through the active layer. The current confinement layer includes an oxide layer that is formed extending from a edge of the current confinement layer in a parallel plane parallel to a surface of the substrate, toward a center of the current confinement layer along the parallel plane, and that does not have an inflection point between the edge and a tip portion formed closer to the center or has a plurality of inflection points formed between the edge and the tip portion.

According to a second aspect related to the innovations herein, provided is A laser device manufacturing method, comprising epitaxially growing an active layer and a current confinement layer above a substrate; forming a mesa post by etching; and forming an oxide layer, which extends from an edge of the current confinement layer in a parallel plane parallel to a surface of the substrate toward a center of the current confinement layer along the parallel plane, and which does not have an inflection point between the edge and a tip portion formed closer to the center or has a plurality of inflection points formed between the edge and the tip portion, by heating the mesa post to a prescribed temperature in a water vapor atmosphere and keeping the mesa post at the prescribed temperature for a prescribed time to cause oxidization of the current confinement layer from a side surface of the mesa post.

According to a third aspect related to the innovations herein, provided is a laser device array comprising a base material; and a plurality of the laser devices described above. The plurality of the laser devices are arranged on the base material in a one-dimensional or two-dimensional array.

According to a fourth aspect related to the innovations herein, provided is a light source comprising the laser device described above; and a control circuit that controls voltage applied to the laser device.

According to a fifth aspect related to the innovations herein, provided is a light module comprising the laser device described above; an optical waveguide that propagates the laser light; and an optical coupling section that optically couples the laser device and the optical waveguide.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
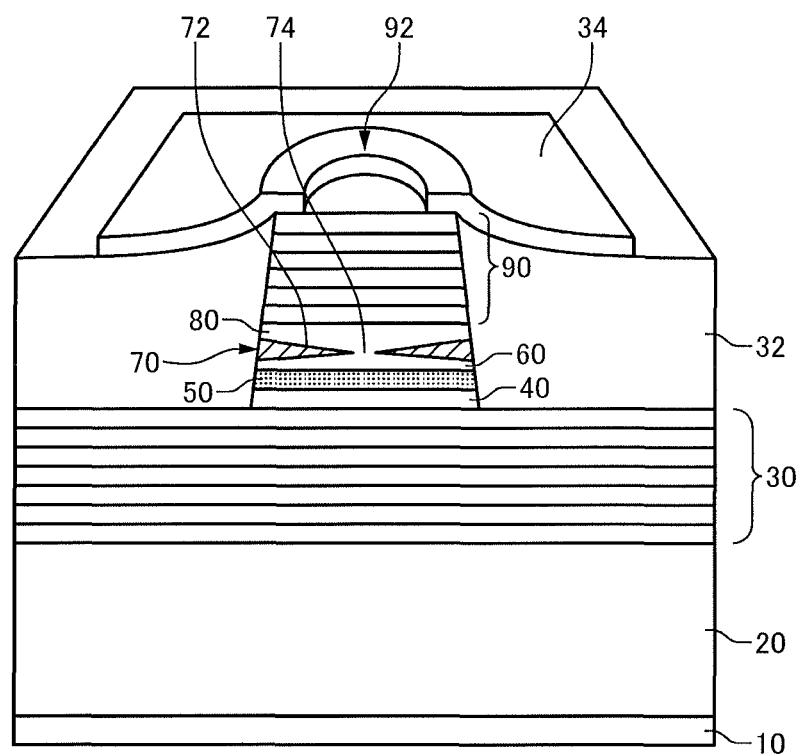
FIG. 1 is a cross-sectional perspective view of a surface emitting laser device according to a first embodiment of the present invention.

FIG. 1 is a cross-sectional perspective view of a surface emitting laser device 100 according to a first embodiment of the present invention. The surface emitting laser device 100 includes a substrate 20, a lower reflective layer 30, an n-type cladding layer 40, an active layer 50, a first p-type cladding layer 60, a current confinement layer 70, a second p-type cladding layer 80, and an upper reflective layer 90. The substrate 20 supports epitaxial layers that are layered sequentially on the surface thereof. The substrate 20 may be an n-type GaAs substrate with a surface orientation of (100).

The lower reflective layer 30 resonates laser light between itself and the upper reflective layer 90. The lower reflective layer 30 may be an n-type DBR mirror. When λ represents the oscillation wavelength of a surface-emitting laser and n represents the refractive index of a material, the n-type DBR mirror may be a multilayer film formed by layering 35.5 pairs of an n-type $Al_{0.9}Ga_{0.1}As$ layer and an n-type GaAs layer that each have a thickness of λ/4n. Here, n is the refractive index of each layer. The upper reflective layer 90 may be a p-type DBR mirror. The p-type DBR mirror may be a multilayer film formed by layering 23 pairs of a p-type $Al_{0.9}Ga_{0.1}As$ layer and a p-type GaAs layer that each have a thickness of λ/4n.

The active layer 50 is formed between the lower reflective layer 30 and the upper reflective layer 90. The active layer 50 may include one or more quantum well layers. The quantum well layer may be formed of GaInNAs, GaInNAsSb, GaAsSb, or InGaAs. For example, the active layer 50 may include three quantum well layers including $GaIn_{0.37}N_{0.01}As$. The thickness of each quantum well layer may be approximately 7.3 nm. In the active layer 50, the center quantum well layer may be arranged at a distance of λ/2N from the top surface of the lower reflective layer 30, so as not to be arranged at an antinode of the standing light wave. Here, N is the average refractive index of the oscillator.

The n-type cladding layer 40 is formed below the active layer 50. The first p-type cladding layer 60 is formed above the active layer 50. The n-type cladding layer 40 and the first p-type cladding layer 60 have greater bandgaps than the active layer 50.

The second p-type cladding layer 80 is formed above the first p-type cladding layer 60, with the current confinement layer 70 interposed therebetween. The second p-type cladding layer 80 is joined to the first p-type cladding layer 60 via a current confinement portion 74 of the current confinement layer 70. The second p-type cladding layer 80 may be formed of the same material as the first p-type cladding layer 60.

The n-type cladding layer 40 may be an n-type GaAs cladding layer. The first p-type cladding layer 60 and the second p-type cladding layer 80 may each include a p-type GaAs cladding layer. When N represents the average refractive index, the n-type cladding layer 40 and the second p-type cladding layer 80 are formed to have a total thickness of λ/N. In this case, the n-type cladding layer 40, the first p-type cladding layer 60, and the second p-type cladding layer 80 are sandwiched between the lower reflective layer 30 and the upper reflective layer 90 to form an optical cavity with a cavity length of λ/N.

The current confinement layer 70 confines the current flowing through the active layer 50. The current confinement layer 70 includes the disc-shaped current confinement portion 74 positioned substantially at the center of a plane parallel to the surface of the substrate 20 and a ring-shaped oxide layer 72 formed by selectively oxidizing the periphery of the current confinement portion 74. The current confinement portion 74 refers to the open portion formed in the oxide layer 72. In other words, the current confinement portion 74 joins the first p-type cladding layer 60 to the second p-type cladding layer 80. The current confinement portion 74 may include p-type AlGaAs.

A mesa post structure may be formed from the n-type cladding layer 40 to the upper reflective layer 90. This mesa post may be fixed by being embedded in the polyimide layer 32. A p-type electrode 34 is formed on the top surfaces of the upper reflective layer 90 and the polyimide layer 32. The p-type electrode 34 may include a layered structure of Ti/Pt/Au. The p-type electrode 34 includes an aperture 92 through which the laser light is emitted. An n-type electrode 10 is formed on the back surface of the substrate 20. The n-type electrode 10 may include a layered structure of AuGeNi/Au.

Figure 2:
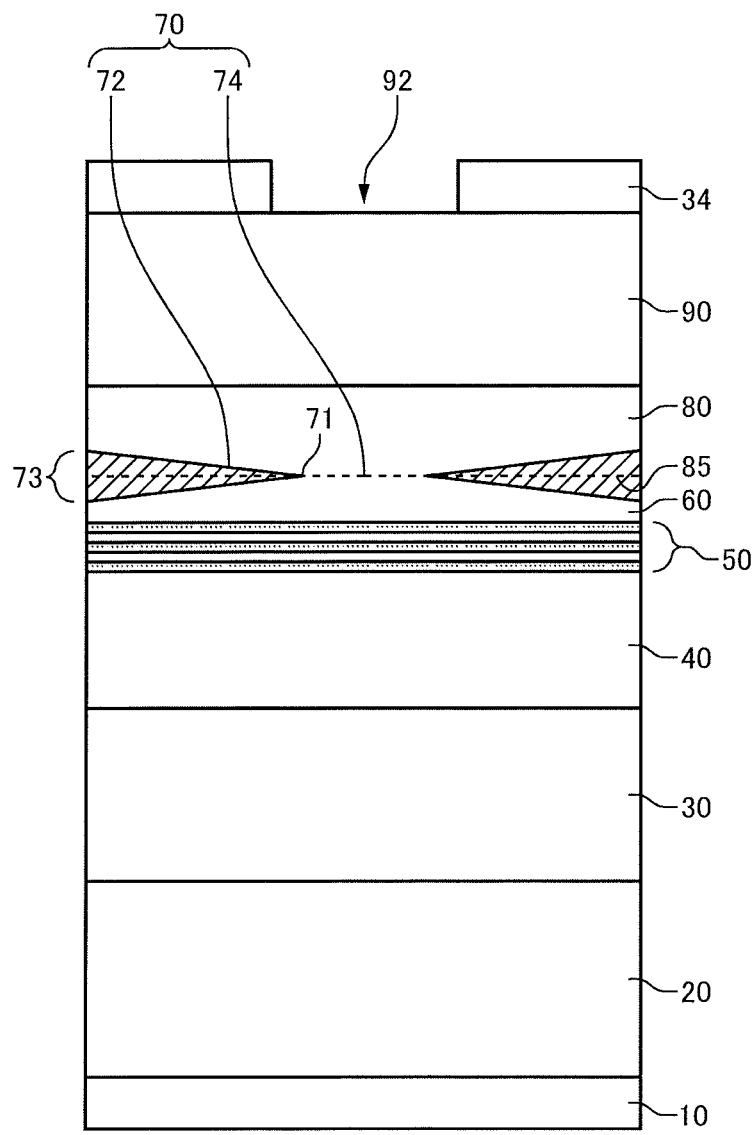
FIG. 2 is a detailed cross-sectional view of a layered structure of the surface emitting laser device.

FIG. 2 is a detailed cross-sectional view of a layered structure of the surface emitting laser device 100. The current confinement layer 70 includes the oxide layer 72 formed to extend from the edge 73 of the current confinement layer 70 in a parallel plane 85 parallel to the surface of the substrate 20, towards the center of the current confinement layer 70 along the parallel plane 85. The parallel plane 85 refers to a plane that is parallel to the surface of the substrate 20 and that passes through the center of the current confinement layer 70. The edge 73 of the current confinement layer 70 refers to the portion contacting the oxide layer 72 and the side surface of the mesa post.

The oxide layer 72 has almost no inflection points from the edge 73 to the tip portion 71. An inflection point refers to a point, excluding the tip portion 71, at which the slope of the top surface or bottom surface of the oxide layer 72 changes non-continuously. The point at which the upper ridge meets the lower ridge of the oxide layer 72 is not considered an inflection point. In other words, the oxide layer 72 does not include inflection points outside of the tip portion. By forming the oxide layer 72 in this way, the oxide layer 72 becomes gradually thicker while also preventing thermal stress from being focused at a particular point.

Figure 3:
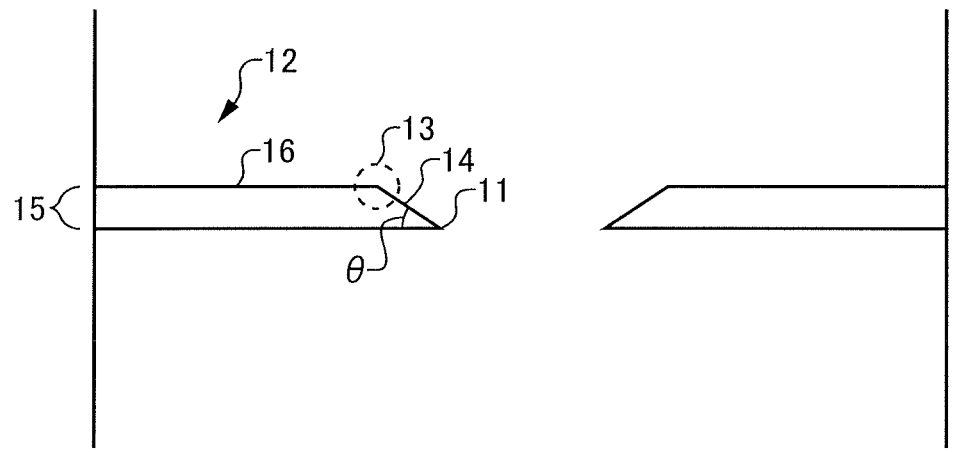
FIG. 3 is a cross-sectional view of an oxide layer having a conventional tapered shape.

FIG. 3 is a cross-sectional view of an oxide layer 12 having a conventional tapered shape. The oxide layer 12 includes a flat portion 16 and a tapered portion 14 on the top surface. The tapered portion 14 and the flat portion 16 have different slopes, and the oxide layer 12 includes an inflection point 13 at an interface between the tapered portion 14 and the flat portion 16.

The oxide layer 12 shown in FIG. 3 is formed by oxidizing a layered body obtained by layering, in the stated order, an AlAs layer with a thickness of 10 nm and an $Al_{0.82}GaAs$ layer with a thickness of 140 nm. A 70 nm GaAs layer is formed in contact with the $Al_{0.82}GaAs$ layer. When water vapor is used to perform oxidation from the side surface of the mesa post, the oxidation progresses from the side surface of the mesa post toward the center. The AlAs layer has a greater Al composition ratio than the $Al_{0.82}GaAs$ layer, and therefore oxidation thereof progresses more quickly to form the tip portion 11. The oxidation of the $Al_{0.82}GaAs$ layer progresses sequentially from the region of the oxidized AlAs layer, thereby forming the tapered portion 14 of the oxide layer 12. The oxidation of the Al$_{0.82}$GaAs layer does not progress in a direction perpendicular to the substrate, due to the GaAs layer.

As an example, the length from the edge 15 of the oxide layer 12 to the tip portion 11 may be 12 µm. The thickness of the oxide layer 12 at the edge 15 may be approximately 150 nm. The length of the tapered portion 14 of the oxide layer 12 in a horizontal direction may be approximately 4 µm. The inclination angle θ of the tapered portion 14 may be from 2° to 10°. A conventional oxide layer 12 includes only one inflection point 13 on the top surface. Accordingly, thermal stress is focused at the inflection point 13, causing the oxide layer 12 to be more easily broken by thermal shock.

Figure 4:
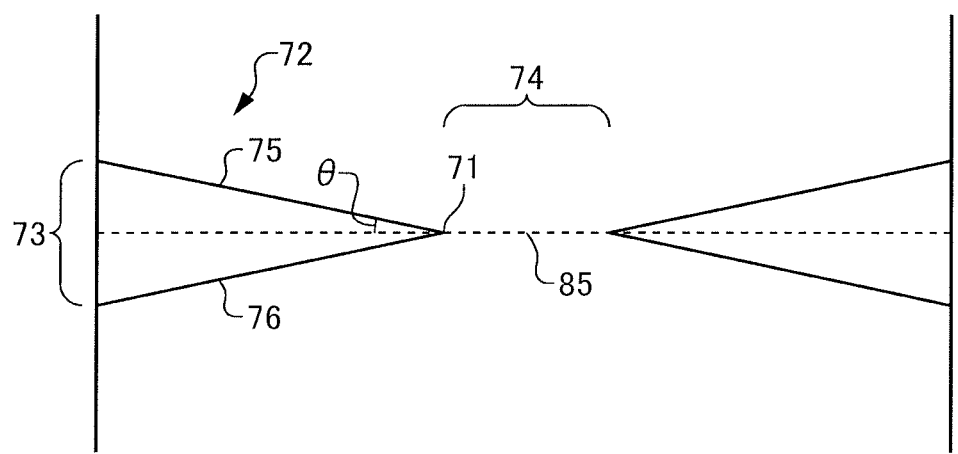
FIG. 4 is a cross-sectional view of one example of the oxide layer of the surface emitting laser device.

FIG. 4 is a cross-sectional view of one example of the oxide layer 72. The oxide layer 72 does not include an inflection point, in the cross-sectional plane parallel to the surface of the substrate 20, between the tip portion 71 provided toward the center and the edge 73 of the oxide layer 72. The oxide layer 72 of the present invention has a thickness that increases at a constant rate from the tip portion 71 to the edge 73. The oxide layer 72 has a top surface 75 that has a first slope relative to the parallel plane 85 parallel to the surface of the substrate 20, and a bottom surface 76 that has a second slope relative to the parallel plane 85. In the present embodiment, the absolute values of the first and second slopes are equal. For example, the oxide layer 72 may have a cross section, in a plane perpendicular to the surface of the substrate 20 and a plane passing through the center of the oxide layer 72 that resembles two isosceles triangles with peaks facing each other. In other words, the oxide layer 72 is symmetric with respect to the parallel plane 85 in a vertical direction.

The angle θ of the first slope may be selected according to the capacitance of the oxide layer 72 to be formed, the diameter of the mesa post, and the diameter of the opening of the current confinement portion 74. The length of the oxide layer 72 in the parallel plane 85 is determined by the diameter of the mesa post and the diameter of the opening of the current confinement portion 74. The capacitance of the oxide layer 72 to be formed depends on a value obtained by integrating the thickness of the oxide layer 72 in the length direction, and therefore the angle θ of the oxide layer 72 can be determined if the capacitance of the oxide layer 72 is determined. For example, when the thickness of the oxide layer 72 at the edge 73 is from 50 nm to 200 nm, the diameter of the mesa post is approximately 30 µm, and the diameter of the opening of the current confinement portion 74 is approximately 6 µm, the angle θ may be from 0.1° to 1°.

Figure 5:
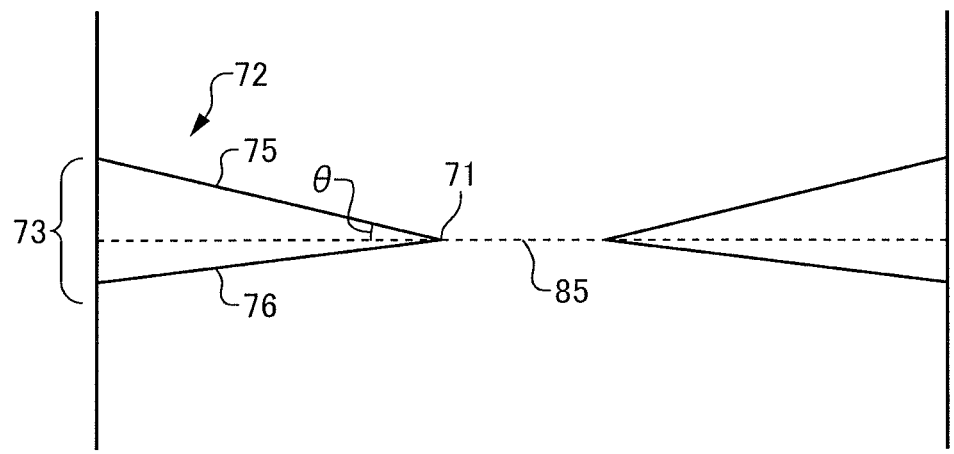
FIG. 5 is a cross-sectional view of another example of the oxide layer of the surface emitting laser device.

FIG. 5 is a cross-sectional view of another example of the oxide layer 72. The oxide layer 72 shown in FIG. 5 differs from the oxide layer 72 shown in FIG. 4 by having different absolute values for the slope of the bottom surface 76 and the slope of the top surface 75. The other portions of this configuration may be the same as in the oxide layer 72 shown in FIG. 4. In other words, the oxide layer 72 of the present embodiment is vertically asymmetrical relative to the parallel plane 85. More specifically, the absolute value of the slope of the top surface 75 is greater than the absolute value of the slope of the bottom surface 76. In other words, in the oxide layer 72 of the present embodiment, the region formed above the parallel plane 85 is thicker than the region formed below the parallel plane 85.

The oxide layer 72 is formed by depositing a plurality of Al$_x$Ga$_{1-x}$As layers having different Al compositions, as described in detail below. When the Al$_x$Ga$_{1-x}$As layers are oxidized, Al$_2$O$_3$ is produced. When this happens, the difference in thermal expansion coefficients between the Al$_x$Ga$_{1-x}$As layer and the Al$_2$O$_3$ causes the volume of the Al$_2$O$_3$ to decrease, thereby causing the oxide layer 72 to distort in a manner to exert a pulling force. Dislocation can be caused in the active layer 50 due to this distortion. Since the bottom portion of the oxide layer 72 is thinner than the top portion, the effect of the distortion on the active layer 50 can be decreased. As a result, dislocation in the active layer 50 is restricted. With this configuration for the oxide layer 72 as well, a surface emitting laser device 100 can be provided that has decreased capacitance and high thermal shock resistance. As a modification, the oxide layer 72 can be formed such that the portion below the parallel plane 85 is thicker than the portion above the parallel plane 85.

Figure 6:
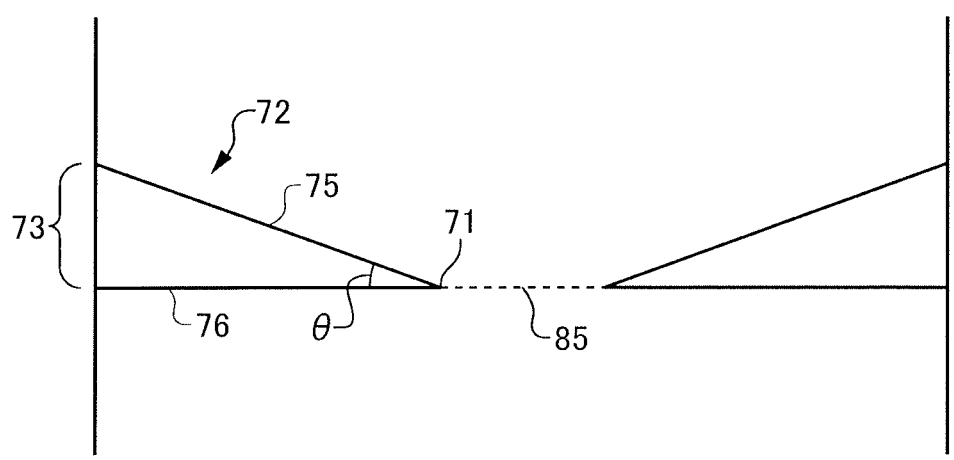
FIG. 6 is a cross-sectional view of another example of the oxide layer of the surface emitting laser device.

FIG. 6 is a cross-sectional view of another example of the oxide layer 72. The oxide layer 72 shown in FIG. 6 differs from the oxide layer 72 shown in FIG. 4 in that the slope of the bottom surface 76 is substantially zero. The other portions of this configuration may be the same as in the oxide layer 72 shown in FIG. 4. The bottom surface 76 may be contained in the parallel plane 85. Only the portion of the oxide layer 72 of the present embodiment above the parallel plane 85 is oxidized, and therefore the effect of distortion on the active layer 50 can be decreased. With this configuration for the oxide layer 72 as well, a surface emitting laser device 100 can be provided that has decreased capacitance and high thermal shock resistance.

Figure 7:
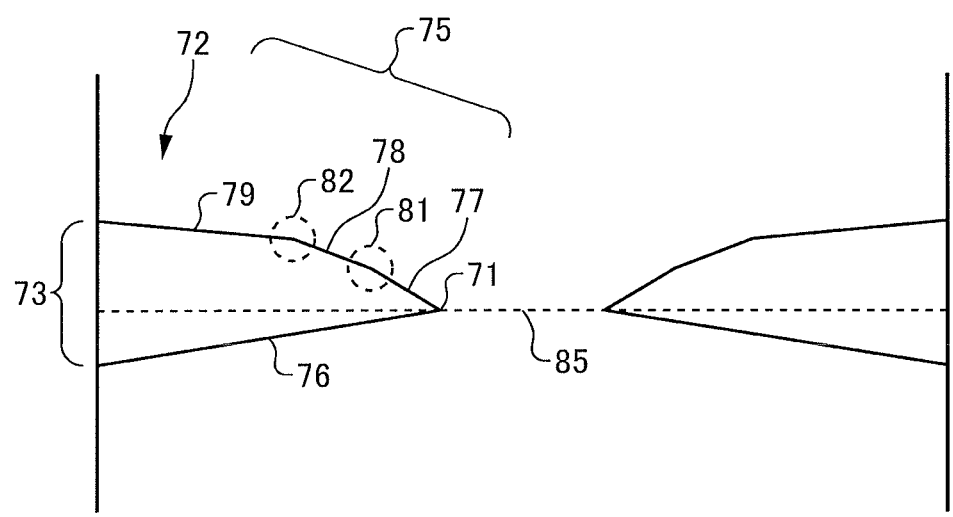
FIG. 7 is a cross-sectional view of another example of the oxide layer of the surface emitting laser device.

FIG. 7 is a cross-sectional view of another example of the oxide layer 72. The oxide layer 72 includes a plurality of inflection points (in this embodiment, the inflection points 81 and 82) formed between the tip portion 71 and the edge 73 on at least one of the top surface 75 and the bottom surface 76. In other words, the thickness of the oxide layer 72 of the present embodiment does not increase at a constant rate from the tip portion 71 toward the edge 73. The oxide layer 72 of the present embodiment includes two inflection points 81 and 82 in the top surface 75. Furthermore, the oxide layer 72 of the present embodiment does not have an inflection point on the bottom surface 76.

Specifically, the top surface 75 of the oxide layer 72 includes a surface 77 with a first slope α relative to the parallel plane 85, a surface 78 with a second slope β relative to the parallel plane 85, and a surface 79 with a third slope γ relative to the parallel plane 85. The relationship between the absolute value of each slope is γ<β<α. The number of inflection points in the present embodiment is not limited to two, and three or more inflection points may be included.

By forming a plurality of inflection points in the same surface of the oxide layer 72 as described above, the thermal stress can be more greatly dispersed than in the configuration of the oxide layer 12 shown in FIG. 3. In other words, each inflection point in the oxide layer 72 disperses thermal stress, and therefore a surface emitting laser device 100 can be provided that has decreased capacitance and high thermal shock resistance.

The following describes a method for manufacturing the surface emitting laser device 100 according to the first embodiment. First, the process for manufacturing the entire surface emitting laser device 100 shown in FIG. 1 will be described. To begin with, an n-type GaAs substrate 20 with surface orientation of (100) is prepared. Next, molecular beam epitaxy (MBE) and metalorganic chemical vapor deposition (MOCVD) are used to epitaxially grow, sequentially on the substrate 20, the lower reflective layer 30, the n-type cladding layer 40, the active layer 50, the first p-type cladding layer 60, the current confinement layer 70, the second p-type cladding layer 80, and the upper reflective layer 90. Next, plasma CVD is used to deposit a silicon nitride film over the entire surface of the upper reflective layer 90, and photolithography and reactive ion etching (RIE) are used to form a circular mask pattern with a diameter of approximately 30 μm, for example.

Next, reactive ion beam etching (RIBE) with a chlorine gas is used to etch until reaching the lower reflective layer 30, thereby forming the mesa post. The resulting structure is then heated to a prescribed temperature, e.g. 400° C., in a water vapor atmosphere and held at the prescribed temperature for a prescribed period. During this prescribed period, the current confinement layer 70 is oxidized to form the oxide layer 72. Next, RIE is used to completely remove the silicon nitride film. After this, the polyimide layer 32 is embedded around the mesa post. Plasma CVD is then used to form a silicon nitride film over the entire surface. After this, photolithography and etching are used to remove the silicon oxide film in a shape of an electrode to form the p-type electrode 34 having the layered structure of Ti/Pt/Au. Finally, an n-type electrode 10 formed of AuGeNi/Au is deposited on the back surface of the substrate 20.

Figure 8:
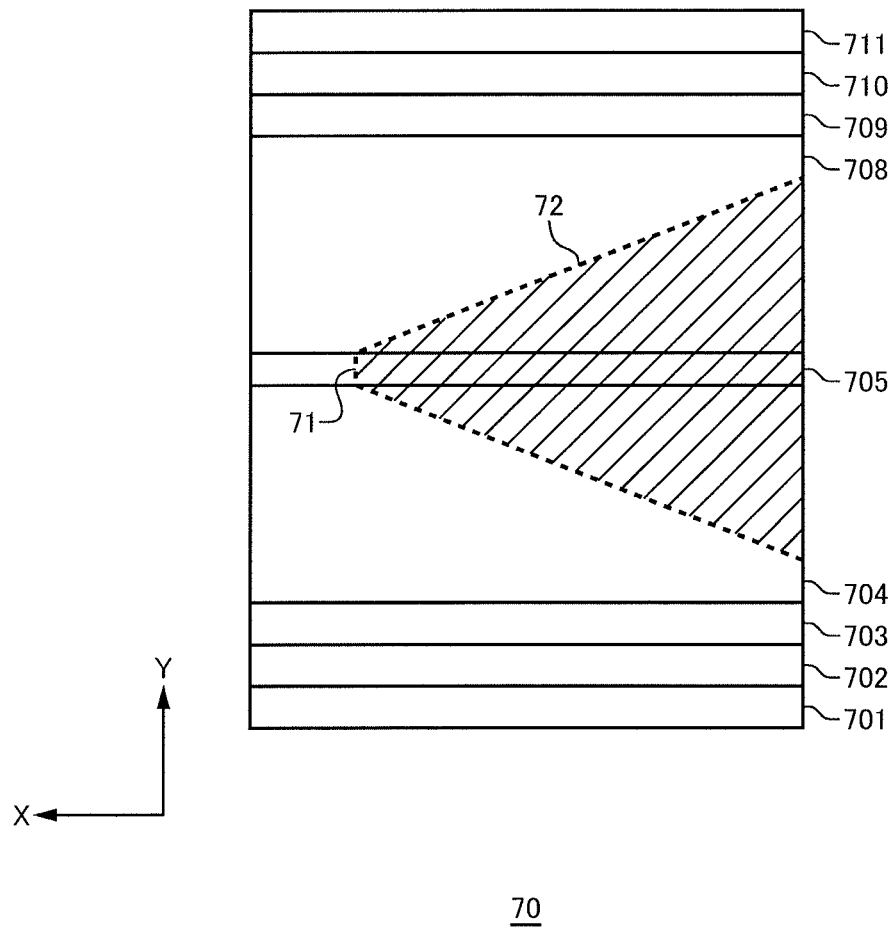
FIG. 8 is a cross-sectional view for describing the process of forming the oxide layer 72 shown in FIG. 4.

FIG. 8 is a cross-sectional view for describing the process of forming the oxide layer 72 in the current confinement layer 70. FIG. 8 is used to describe an example of forming the oxide layer 72 shown in FIG. 4. The current confinement layer 70 includes a first layer 705 containing $Al_xGa_{1-x}As$ (0<x<1), a second layer 708 containing $Al_yGa_{1-y}As$ (0<y<1, x>y) formed above the first layer 705, and a third layer 704 containing $Al_zGa_{1-z}As$ (0<z<1, x>z) formed below the first layer 705.

The Al composition ratio of the first layer 705 is greater than the Al composition ratios of the second layer 708 and the third layer 704. The Al composition ratio of the first layer 705 may be at a maximum at the current confinement layer 70. The Al composition ratio of the first layer 705 may be from 0.96 to 0.995. The Al composition ratios of the second layer 708 and the third layer 704 may each be from 0.7 to 0.85. In the present example, the second layer 708 and the third layer 704 have the same Al composition ratio.

The current confinement layer 70 may include, below the third layer 704, a plurality of layers with gradually decreasing Al composition ratios in a direction moving away from the first layer 705. For example, an $Al_{0.2}Ga_{0.8}As$ layer 701, an $Al_{0.4}Ga_{0.6}As$ layer 702, and an $Al_{0.6}Ga_{0.4}As$ layer 703 may be sequentially layered in the stated order from the substrate 20 side, between the third layer 704 and the first p-type cladding layer 60.

Furthermore, the current confinement layer 70 may include, above the second layer 708, a plurality of layers with gradually lower Al composition ratios farther from the first layer 705. For example, an $Al_{0.6}Ga_{0.4}As$ layer 709, an $Al_{0.4}Ga_{0.6}As$ layer 710, and an $Al_{0.2}Ga_{0.8}As$ layer 711 may be sequentially layered in the stated order from the second layer 708 side, between the second layer 708 and the second p-type cladding layer 80.

The thickness of the second layer 708 is greater than the thickness of the first layer 705. The thickness of the third layer 704 is greater than the thickness of the first layer 705. When the diameter of the mesa post is from 20 μm to 60 μm, the thickness of the first layer 705 may be from 15 nm to 60 nm. When the diameter of the mesa post is 30 μm, the thickness of the first layer 705 may be 25 nm. The thickness of each of the second layer 708 and the third layer 704 may be from 30 nm to 100 nm. In the present example, the second layer 708 has the same thickness as the third layer 704. The second layer 708 and the third layer 704 may be formed by an AlGaAs/AlAs digital alloy.

With the above structure, the side surface of the first layer 705 is exposed at the side surface of the mesa post, and the current confinement layer 70 is oxidized via the side surface of the first layer 705. As a result, in the first layer 705, the oxidation progresses from the side surface of the mesa post toward the center. In each of the other layers, the oxidation progresses from the oxidized region of the first layer 705 in a vertical direction. The oxide layer 72 is formed by the first layer 705, the second layer 708, and the third layer 704, and the tip portion 71 of the oxide layer 72 may be formed in the first layer 705.

For the layers other than the first layer 705, the oxidation progresses after the oxidation of the first layer 705, and therefore the oxidation period is shorter for locations farther from the side surface of the mesa post. As a result, the thickness of the oxide layer 72 in each layer becomes smaller farther from the side surface of the mesa post, with a slope corresponding to the Al composition. Since each layer has a constant Al composition, the slope of the oxide layer 72 is practically constant. Accordingly, by making the second layer 708 and the third layer 704 sufficiently thick, the oxide layer 72 is formed extending from the edge 73 toward the center without having inflection points between the edge 73 and the tip portion 71 located closer to the center. In the present example, the second layer 708 and the third layer 704 have the same Al composition ratio and sufficient thickness. Accordingly, the vertically symmetrical oxide layer 72 shown in FIG. 4 is formed.

The tip portion 71 of the oxide layer 72 refers to a region of the first layer 705, which has the highest Al composition ratio in the current confinement layer 70, at the tip of the oxide layer 72 between the interfaces with the second layer 708 and the third layer 704. In other words, in the oxide layer 72, inflection points may be included in the region from the interface between the first layer 705 and another layer to the tip.

As another example, the second layer 708 and the third layer 704 may have different Al composition ratios and thicknesses. Specifically, the third layer 704 may be thinner and have a lower Al composition ratio than the second layer 708. In this case, the oxidation rate vector of the third layer 704 is less than the oxidation rate vector of the second layer 708. As a result, the vertically asymmetrical oxide layer 72 shown in FIG. 5 is formed.

As a modification, the third layer 704 may be a GaAs layer. In this case, the oxidation does not progress in the direction of the third layer 704. As a result, the oxide layer 72 in which the bottom surface 76 is contained in the parallel plane 85 shown in FIG. 6 is formed.

Figure 9:
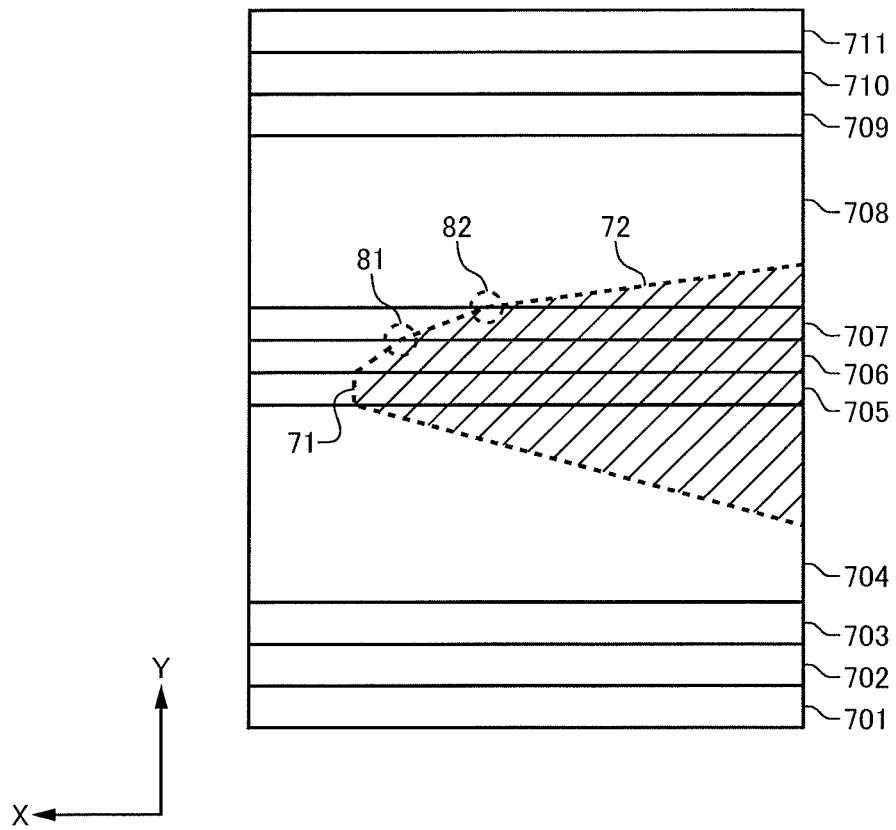
FIG. 9 is a cross-sectional view for describing another exemplary process for forming the oxide layer shown in FIG. 7.

FIG. 9 is a cross-sectional view for describing another exemplary process for forming the oxide layer 72. The following describes an example of forming the oxide layer 72 shown in FIG. 7. The current confinement layer 70 differs from the example shown in FIG. 8 by including, between the first layer 705 containing $Al_xGa_{1-x}As$ (0<x<1) and the second layer 708 containing $Al_yGa_{1-y}As$ (0<y<1, y<x) and formed above the first layer 705, a fourth layer 706 containing $Al_aGa_{1-a}As$ (0<a<1, y<a<x) and a fifth layer 707 containing $Al_bGa_{1-b}As$ (0<b<1, y<b<a). The Al composition ratio of the fourth layer 706 is less than the Al composition ratio of the first layer 705 and greater than the Al composition ratio of the second layer 708.

The Al composition of the fifth layer 707 is less than the Al composition ratio of the fourth layer 706 and greater than the Al composition ratio of the second layer 708. In other words, in the present embodiment, the Al composition ratios are in a relationship such that y<b<a<x, z<x. The thickness of each of the fourth layer 706 and the fifth layer 707 is greater than or equal to the thickness of the first layer 705, and less than or equal to the thickness of the second layer 708. For example, the thickness of the fourth layer 706 may be greater than the thickness of the first layer 705, and the thickness of the fifth layer 707 may be greater than the thickness of the fourth layer 706.

By adjusting the thickness and Al composition ratio of each layer, a plurality of inflection points can be formed in the oxide layer 72. For example, by setting the thickness of the fourth layer 706 to be less than a prescribed thickness, an inflection point can be formed at the interface between the fourth layer 706 and the fifth layer 707. This prescribed thickness refers to a thickness that results in the oxidation progressing to the fifth layer 707 within a period from when the oxidation of the fourth layer 706 begins to when the formation of the oxide layer 72 is finished. The rate at which the oxidation progresses is determined by the Al composition of the fourth layer 706. Therefore, by adjusting the thickness and the Al composition ratio of the fourth layer 706, inflection points can be formed at desired locations between the tip portion 71 and the edge 73.

Similarly, by adjusting the thickness and Al composition ratio of the fifth layer 707, an inflection point can be formed at the interface between the fifth layer 707 and the second layer 708. Furthermore, by making the second layer 708 sufficiently thick, the inflection points are not formed between the edge 73 and the interface of the fifth layer 707 and the second layer 708. In other words, in this example, the oxide layer 72 is formed by the first layer 705, the second layer 708, the third layer 704, the fourth layer 706, and the fifth layer 707, the tip portion 71 of the oxide layer 72 is formed in the first layer 705, and the inflection points 81 and 82 are formed respectively at the interface between the fourth layer 706 and the fifth layer 707 and the interface between the fifth layer 707 and the second layer 708.

By adjusting the Al composition ratio and the thickness of each layer of the current confinement layer 70 in this way, the oxide layer 72 can be formed with a variety of configurations. Therefore, the stress in the oxide layer 72 can be dispersed. The number of inflection points is not limited to two. Furthermore, a plurality of inflection points may be formed on the bottom surface of the oxide layer 72, or a plurality of inflection points may be formed on both the top and bottom surface of the oxide layer 72.

Figure 10:
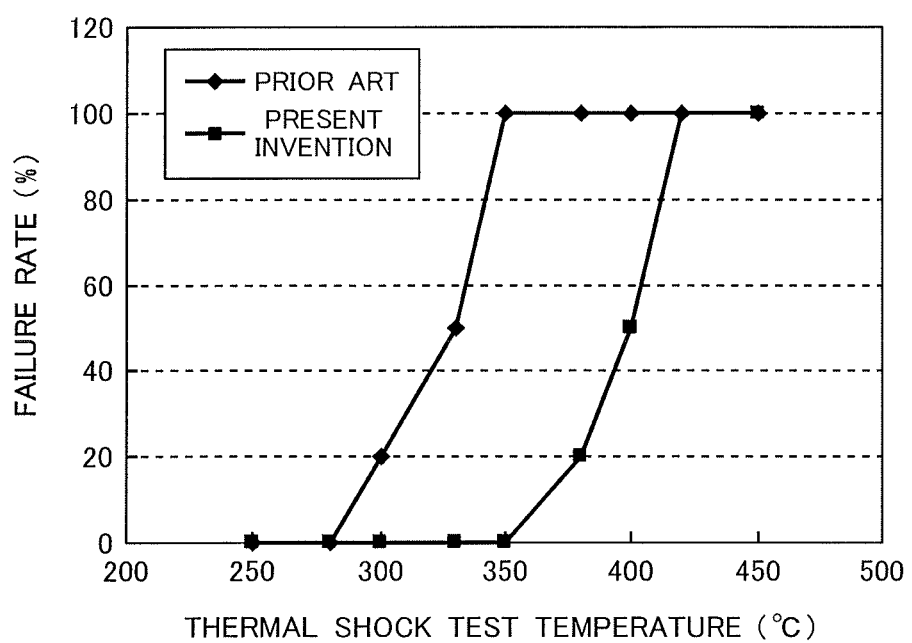
FIG. 10 shows results obtained by performing thermal shock tests on a plurality of samples of the conventional oxide layer shown in FIG. 3 and the oxide layer according to the first embodiment of the present invention shown in FIG. 4.

FIG. 10 shows results obtained by performing thermal shock tests on a plurality of samples of the conventional oxide layer 12 shown in FIG. 3 and the oxide layer 72 according to the first embodiment of the present invention shown in FIG. 4. The conventional oxide layers 12 began to break from approximately 280° C., half of the oxide layers 12 were broken at 330° C., and all of the oxide layers 12 were broken at 350° C. This is believed to be because, when the temperature changes at the interface between the AlGaAs and the $Al_2O_3$ having different thermal expansion coefficients, the thermal stress is focused at a single inflection point in a conventional oxide layer 12, and therefore the oxide layer 12 is broken due to thermal shock. On the other hand, none of the oxide layers 72 of the present application were broken at 350° C., which is a temperature at which all of the conventional oxide layers 12 were broken. Even at a temperature of approximately 400° C., half of the oxide layers 72 remained unbroken, and all of the oxide layers 72 finally broke at approximately 420° C. This is believed to be because the oxide layers 72 of the present application do not include inflection points, and therefore the thermal stress is not focused at the interface between the AlGaAs and the $Al_2O_3$.

Using the oxide layer 72 of the present invention, a surface emitting laser device 100 can be provided that has decreased capacitance and high thermal shock resistance. Furthermore, since a complex manufacturing process is not required, the manufacturing yield is improved. As a result, a surface emitting laser device that is highly reliable and can operate at high speeds from 25 Gbps to 45 Gbps can be provided. It is obvious that the laser device is not limited to a surface emitting laser device, and that an edge emitting laser device with the same high reliability can be obtained using the oxidation layer of the present invention.

Figure 11:
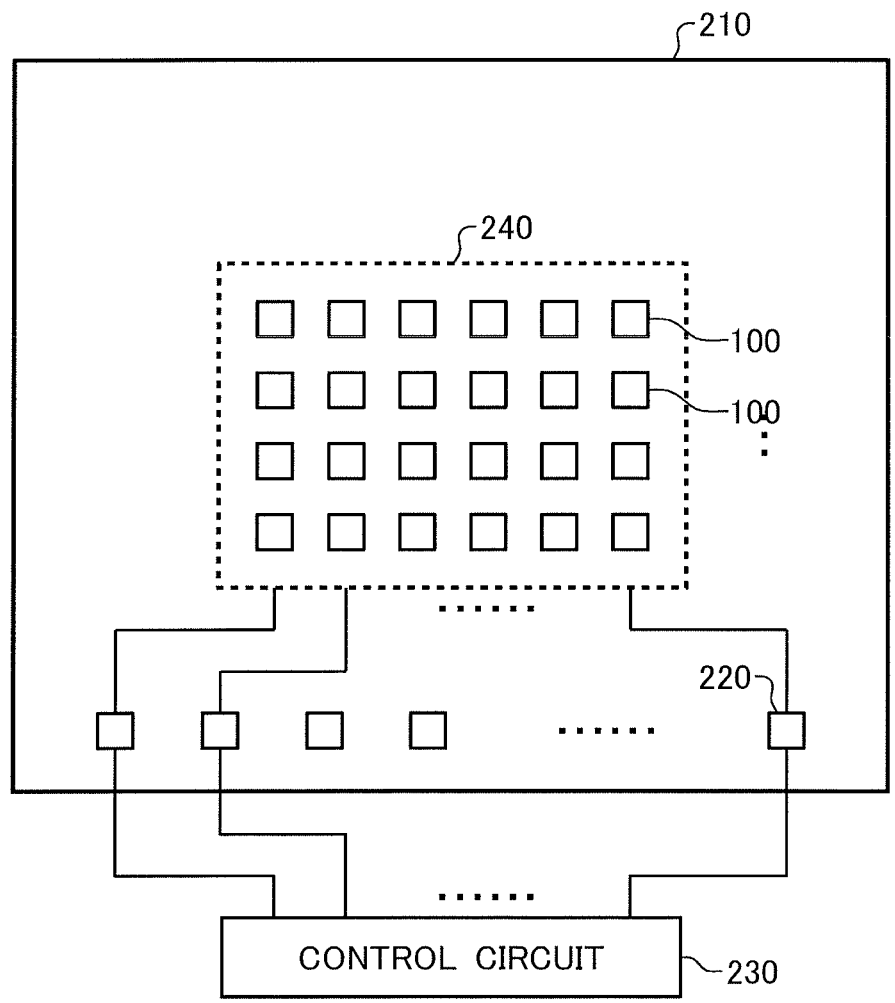
FIG. 11 shows a surface emitting laser array apparatus according to a second embodiment of the present invention.

FIG. 11 shows a surface emitting laser array apparatus 200 according to a second embodiment of the present invention. The surface emitting laser array apparatus 200 includes a base material 210, a surface emitting laser array 240, an electrode pad 220, and a control circuit 230. The surface emitting laser array 240 is positioned substantially in the center of the base material 210 with a plurality of electrode pads 220 around the periphery of the base material 210, thereby forming a single chip. A plurality of surface emitting laser devices 100 are arranged on the surface emitting laser array 240 in a two-dimensional array. Each electrode pad 220 is connected via wiring to a corresponding surface emitting laser device 100 of the surface emitting laser array 240.

The control circuit 230 is arranged outside of the base material 210. The control circuit 230 controls the light emission of each surface emitting laser device 100 in the surface emitting laser array 240, via the electrode pads 220. Specifically, the control circuit 230 applies a modulated voltage and a bias voltage to each surface emitting laser device 100 of the surface emitting laser array 240, via the electrode pads 220. The surface emitting laser devices 100 emit laser light with a prescribed wavelength from the top portions thereof, in response to the voltage being applied.

Figure 12:
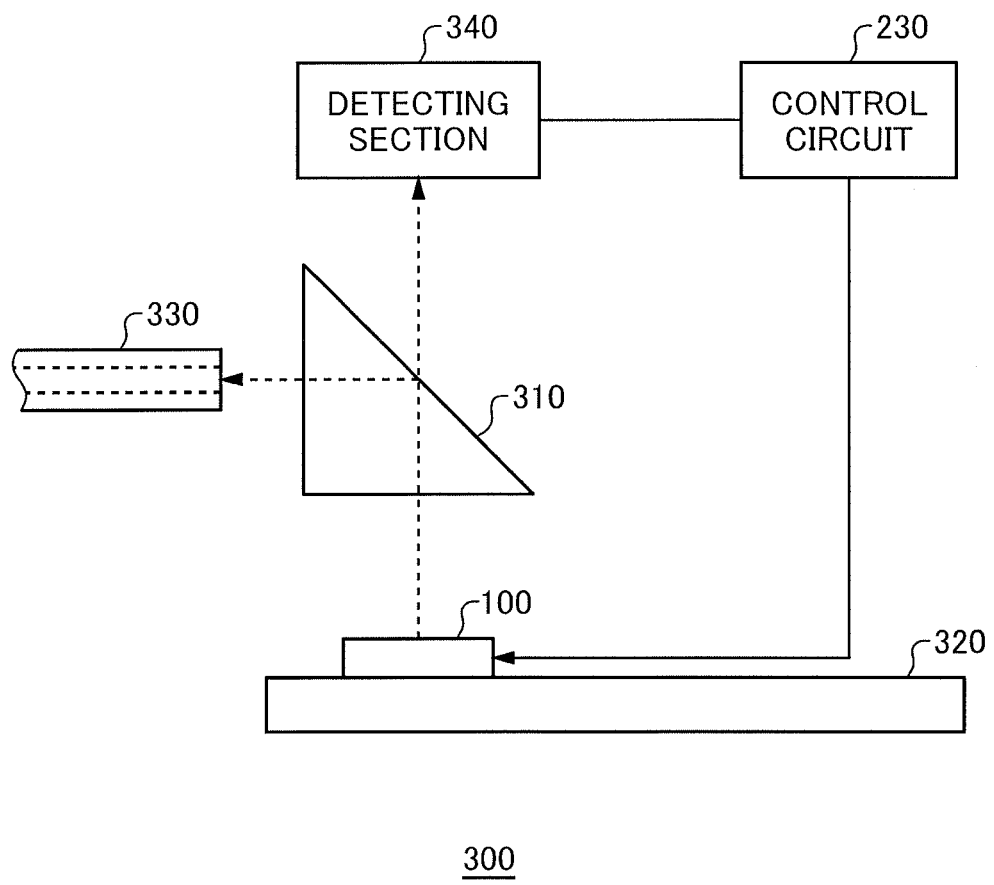
FIG. 12 shows an optical module according to a third embodiment of the present invention.

FIG. 12 shows an optical module 300 according to a third embodiment of the present invention. The optical module 300 includes a surface emitting laser device 100, an optical coupling section 310, an optical fiber 330 that propagates laser light, a detecting section 340, a control circuit 230, and a holding member 320. The surface emitting laser device 100 is fixed to the holding member 320. The optical coupling section 310 is formed by a transparent resin shaped as a triangular prism. The optical coupling section 310 includes a light receiving surface that faces the surface emitting laser device 100, an emitting surface that faces the optical fiber 330, and a reflective surface that forms an angle of 45 degrees relative to the light receiving surface and the emitting surface.

The optical coupling section 310 receives the laser light output by the surface emitting laser device 100 at the light receiving surface, reflects the light at the reflective surface, and outputs the light from the emitting surface to be coupled by the optical fiber 330. In other words, the optical coupling section 310 optically couples the surface emitting laser device 100 and the optical fiber 330. The laser light emitted from the emitting surface is propagated in the optical fiber 330. The detecting section 340 monitors the light passed through the reflective surface of the optical coupling section 310. The detecting section 340 converts the optical signal into an electrical signal, and sends the electrical signal to the control circuit 230. The control circuit 230 performs feedback control of the surface emitting laser device 100, based on the signal from the detecting section 340.

The optical coupling section 310 may be a reflective film that is mirror-finished to reflect the laser light from the surface emitting laser device 100 toward the optical fiber 330. As another example, the optical coupling section 310 may be a lens that focuses the laser light from the surface emitting laser device 100 at the optical fiber 330. For example, when the surface emitting laser device 100 and the optical fiber 330 are arranged facing each other, the optical coupling section 310 may be arranged between the surface emitting laser device 100 and the optical fiber 330.

Figure 13:
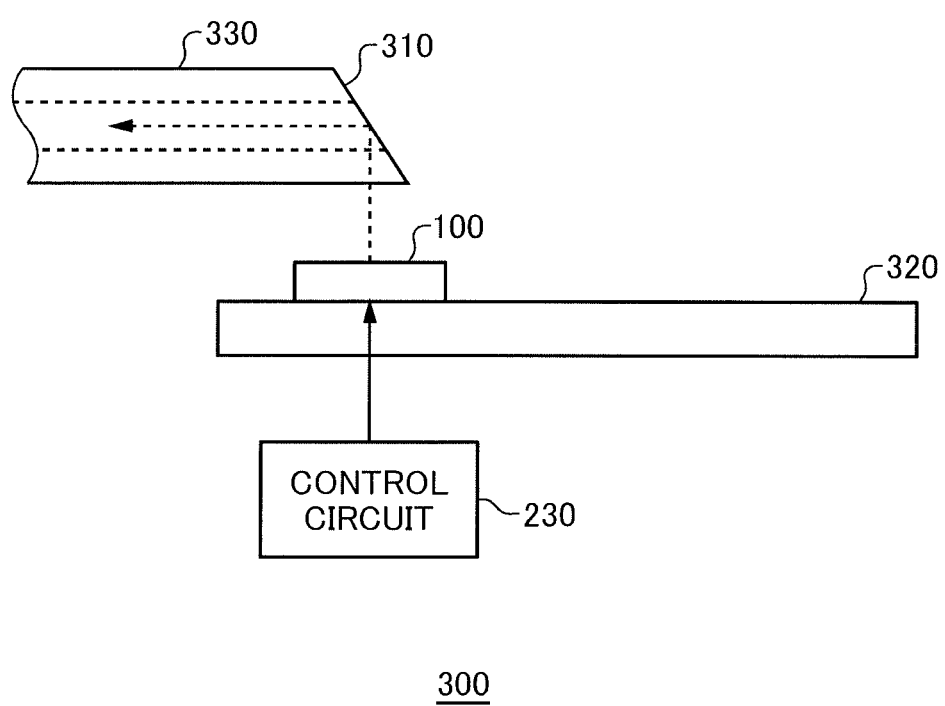
FIG. 13 shows another example of the optical module.

FIG. 13 shows another example of the optical module 300. In this example, the optical coupling section 310 is formed by processing the optical fiber 330 such that the facet thereof forms an angle of 45 degrees relative to the optical axis. A reflective film is formed on the facet by mirror-finishing. The surface emitting laser device 100 is positioned by the holding member 320 to be below the optical coupling section 310. When voltage is applied by the control circuit 230, the surface emitting laser device 100 emits laser light upward. The emitted laser light is reflected by the optical coupling section 310 and coupled to the optical fiber 330, and then propagated within the optical fiber 330.

The optical coupling section 310 can adopt a variety of configurations other than those shown in FIGS. 12 and 13. For example, the optical coupling section 310 may include a housing that fixes one end of a core line of the optical fiber 330 to face the body of the optical fiber 330 and the other end to face the surface emitting laser device 100.

Figure 14:
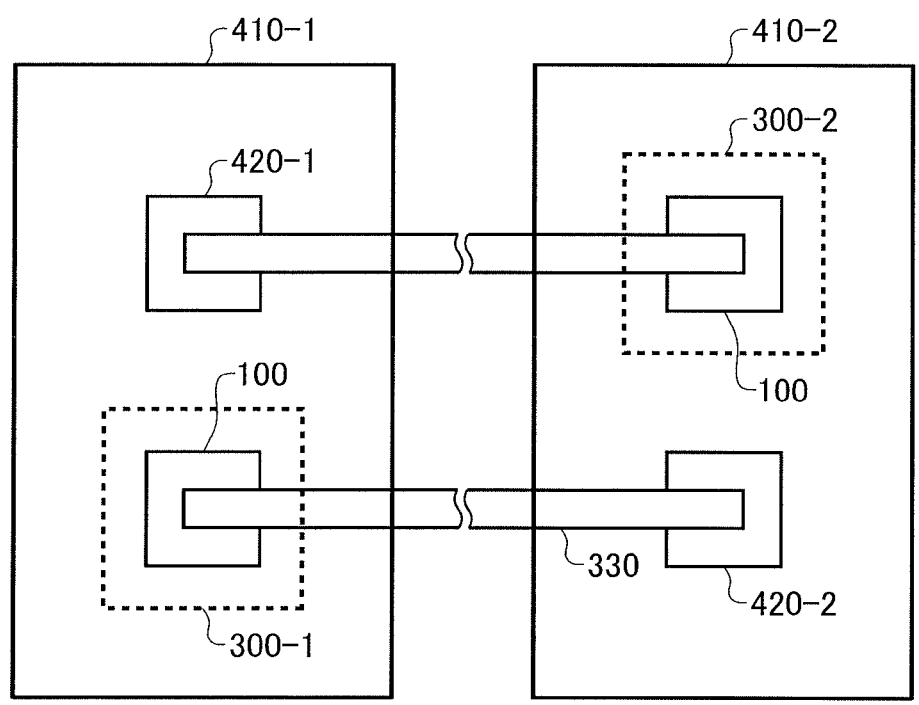
FIG. 14 shows an optical communication system according to a fourth embodiment of the present invention.

FIG. 14 shows an optical communication system 400 according to a fourth embodiment of the present invention. The optical communication system 400 includes two optical transceiver modules 410-1 and 410-2. The two optical transceiver modules 410-1 and 410-2 are connected to each other by two optical fibers 330. The optical transceiver 410-1 includes an optical module 300-1 having a surface emitting laser device 100 and a light receiving element 420-1. The optical module 300-1 transmits the laser light emitted by the surface emitting laser device 100, via the optical fiber 330. The light receiving element 420-1 receives the optical signal transmitted by via the optical fiber 330, and converts this optical signal into an electrical signal. The optical transceiver module 410-2 includes an optical module 300-2 having a surface emitting laser device 100 and a light receiving element 420-2. The optical transceiver module 410-2 has the same configuration as the optical transceiver module 410-1, except that the positional relationship between the optical module and the light receiving element is reversed.

Figure 15:
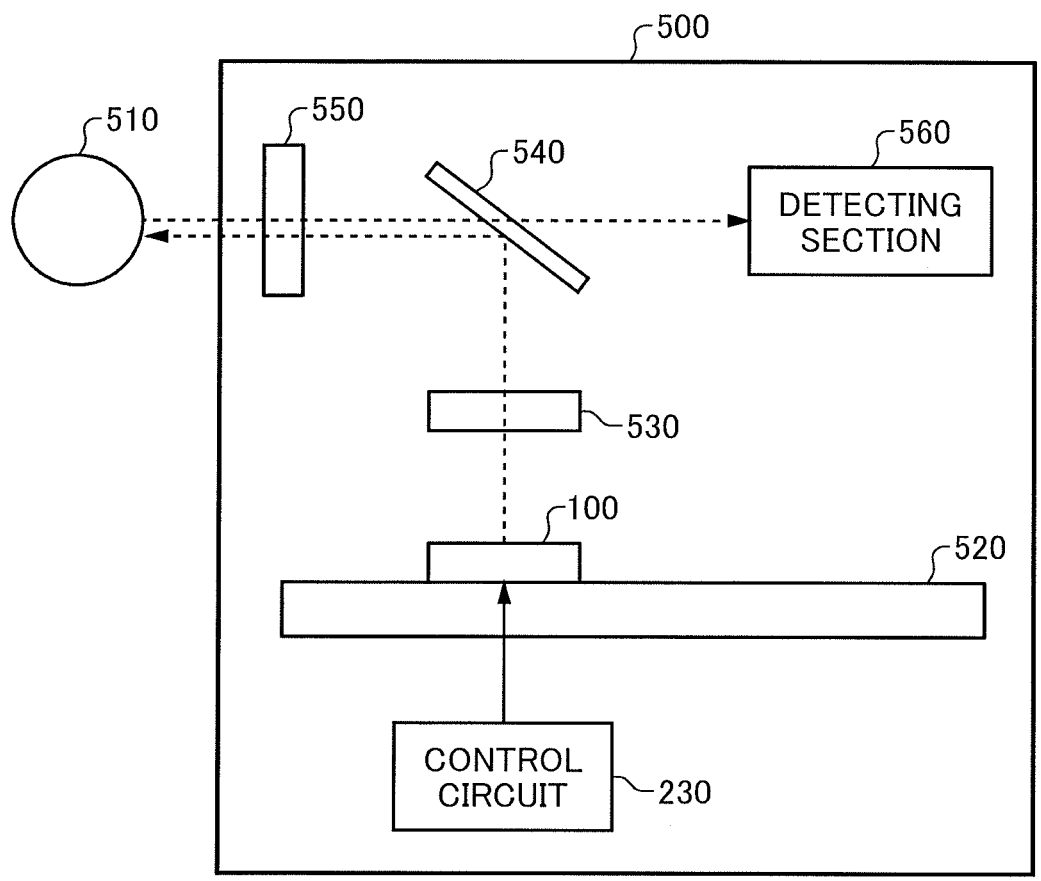
FIG. 15 shows a light source according to a fifth embodiment of the present invention.

FIG. 15 shows a light source 500 according to a fifth embodiment of the present invention. The following describes an example using a light source for optical pickup as the light source 500, but the light source 500 of the present embodiment is not limited to this. The light source 500 includes a surface emitting laser device 100, a substrate 520, a diffraction grating 530, a half mirror 540, a lens 550, a detecting section 560, and a control circuit 230. The surface emitting laser device 100 is implemented on the substrate 520. The half mirror 540 is arranged above the surface emitting laser device 100. The diffraction grating 530 is arranged between the half mirror 540 and the surface emitting laser device 100. The lens 550 focuses the laser light reflected by the half mirror 540 at an external optical storage medium 510.

The detecting section 560 is arranged on a side of the half mirror 540 opposite the lens 550, such that the half mirror 540 is between the detecting section 560 and the lens 550. The control circuit 230 applies a modulated voltage and a bias voltage to the surface emitting laser device 100. The surface emitting laser device 100 emits laser light from the top portion thereof in response to the voltage applied from the control circuit 230. The half mirror 540 reflects the laser light passed through the diffraction grating 530 toward the lens 550. The lens 550 focuses the laser light reflected by the half mirror 540 at a prescribed position of the optical storage medium 510. The detecting section 560 receives the light reflected from the optical storage medium 510. The detecting section 560 converts the received optical signal into an electrical signal. The electrical signal is transmitted to an external personal computer, for example, in order for information to be read. Instead of an optical pickup, the surface emitting laser device 100 may be used as a scanning and exposing light source for a printer or a photolithography machine for a photoresist, a light source for laser pumping, a light source for a machining fiber laser, or a light source for optical equipment such as measurement equipment, a laser pointer, or an optical mouse.

Figure 16:
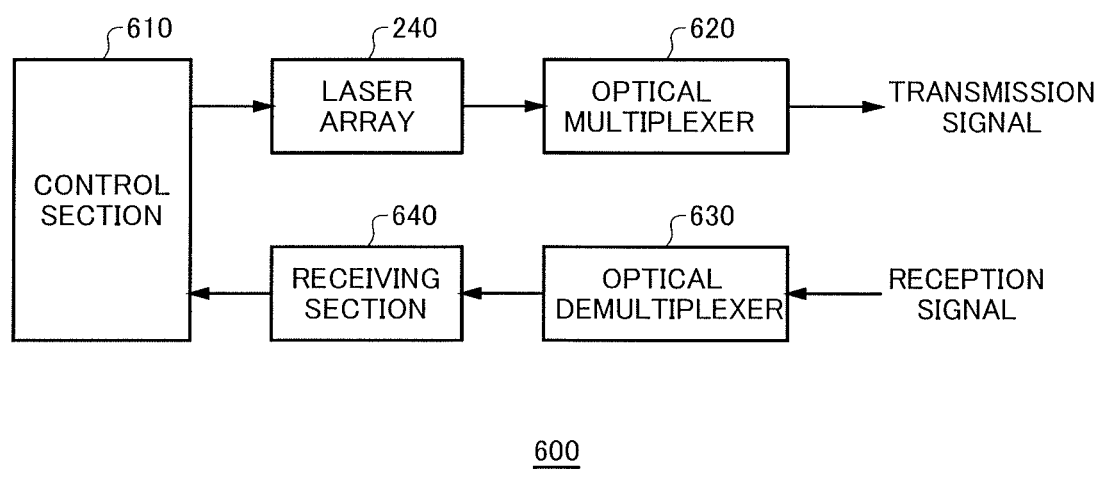
FIG. 16 shows a wavelength-multiplexing transmission system according to a sixth embodiment of the present invention.

FIG. 16 shows a wavelength-multiplexing transmission system 600 according to a sixth embodiment of the present invention. The wavelength-multiplexing transmission system 600 includes an optical demultiplexer 630, a receiving section 640, a control section 610, a surface emitting laser array 240, and an optical multiplexer section 620. The control section 610 includes a CPU, an MPU, and a wavelength control circuit, for example. The surface emitting laser array 240 is formed by a plurality of surface emitting laser devices 100 having different oscillation wavelengths and arranged in a one-dimensional or two-dimensional array. The control section 610 supplies drive power to the surface emitting laser array 240, and also supplies different signals to each surface emitting laser device 100 in the surface emitting laser array 240 to cause each surface emitting laser device 100 to output an optical signal. The optical multiplexer 620 wavelength-multiplexes the optical signals transmitted through optical fibers, and couples the result to a single optical fiber to be transmitted as a transmission signal to a communication target. The optical demultiplexer 630 demultiplexer a wavelength-multiplexed reception signal, which is transmitted from the communication target via an optical fiber, into the respective wavelengths, and transmits each resulting optical signal to the receiving section 640. The receiving section 640 includes a plurality of light receiving elements. Each light receiving element converts the received optical signal into an electrical signal, and transmits the electrical signal to the control section 610.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a laser device with reduced capacitance that is resistant to thermal shock, a laser device manufacturing method, a laser device array, a light source, and an optical module.

What is claimed is:

1. A laser device configured to output laser light, the laser device comprising:

a substrate; and
a mesa post on the substrate, the mesa post comprising:
- an active layer formed above the substrate; and
- a current confinement layer configured to confine current flowing through the active layer, wherein the current confinement layer includes
- a first layer,
- a second layer,
- a third layer, and
- an oxide layer that is formed in the first, second and third layers, in a thickness direction of the substrate, the first layer is arranged below the second layer and above the third layer, Al contents of the second layer and the third layer are smaller than an Al content of the first layer, the Al content of the first layer is a maximum Al content of the current confinement layer, thicknesses of the second layer and the third layer in the thickness direction of the substrate are greater than a thickness of the first layer in the thickness direction of the substrate, the oxide layer extends from a side surface of the mesa post to a tip portion, between the side surface of the mesa post and the tip portion,
- the entire thickness of the first layer is occupied by the oxide layer,
- the entire thickness of the second layer is not occupied by the oxide layer, and
- the entire thickness of the third layer is not occupied by the oxide layer, at least one of
- (a) in the second layer, the oxide layer has a triangular shape with sides formed by the side surface of the mesa post and a bottom surface of the second layer, respectively, and
- (b) in the third layer, the oxide layer has a triangular shape with sides formed by the side surface of the mesa post and an upper surface of the third layer, respectively, and at least one of
- (i) in the thickness direction of the substrate, a maximum thickness of the oxide layer in the second layer is greater than the thickness of the first layer, and
- (ii) in the thickness direction of the substrate, a maximum thickness of the oxide layer in the third layer is greater than the thickness of the first layer.

2. The laser device according to claim 1, further comprising:
a lower reflective layer and an upper reflective layer, wherein
the active layer is formed, in the thickness direction of the substrate, between the lower reflective layer and the upper reflective layer.

3. The laser device according to claim 1, wherein, in the thickness direction of the substrate, the oxide layer has a thickness that increases at a constant rate from the tip portion toward the side surface of the mesa post.

4. The laser device according to claim 1, wherein the oxide layer is symmetrical with respect to a parallel plane parallel to a surface of the substrate and passing through the tip portion.

5. The laser device according to claim 1, wherein the oxide layer is asymmetrical with respect to a parallel plane parallel to a surface of the substrate and passing through the tip portion.

6. The laser device according to claim 5, wherein a maximum thickness of a portion of the oxide layer above the parallel plane is greater than a maximum thickness of a portion of the oxide layer below the parallel plane.

7. The laser device according to claim 5, wherein a bottom surface of the oxide layer is contained in the parallel plane.

8. The laser device according to claim 1, wherein
the first layer contains $Al_xGa_{1-x}As$ ($0<x<1$),
the second layer contains $Al_yGa_{1-y}As$ ($0<y<1$, $x>y$), and
the tip portion of the oxide layer is formed in the first layer.

9. The laser device according to claim 8, wherein the second layer includes a digital alloy.

10. The laser device according to claim 1, wherein
the first layer contains $Al_xGa_{1-x}As$ ($0<x<1$),
the second layer contains $Al_yGa_{1-y}As$ ($0<y<1$, $x>y$),
the third layer contains $Al_zGa_{1-z}As$ ($0<z<1$, $x>z$), and
the tip portion of the oxide layer is formed in the first layer.

11. The laser device according to claim 10, wherein
the current confinement layer further includes:
- a fourth layer containing $Al_aGa_{1-a}As$ ($0<a<1$, $y<a<x$) and formed between the first layer and the second layer; and
- a fifth layer containing $Al_bGa_{1-b}As$ ($0<b<1$, $y<b<a$) and formed between the fourth layer and the second layer, the oxide layer is also formed in the fourth layer and the fifth layer, and an upper surface of the oxide layer has inflection points respectively at
an interface between the fourth layer and the fifth layer, and
an interface between the fifth layer and the second layer.

12. A laser device array, comprising:
a base material; and
a plurality of the laser devices according to claim 1, wherein
the plurality of the laser devices are arranged on the base material in a one-dimensional or two-dimensional array.

13. A light source, comprising:
the laser device according to claim 1; and
a control circuit configured to control a voltage applied to the laser device.

14. A light module, comprising:
the laser device according to claim 1;
an optical waveguide configured to propagate the laser light; and
an optical coupling section that optically couples the laser device and the optical waveguide.

15. The laser device according to claim 1, wherein
in the second layer, the triangular shape of the oxide layer has perpendicular sides formed by the side surface of the mesa post and the bottom surface of the second layer, respectively, and
in the third layer, the triangular shape of the oxide layer has perpendicular sides formed by the side surface of the mesa post and the upper surface of the third layer, respectively.

16. A method of manufacturing a laser device,
the laser device comprising a substrate and a mesa post on the substrate, the mesa post comprising:
- an active layer formed above the substrate; and
- a current confinement layer configured to confine current flowing through the active layer, wherein the current confinement layer includes
- a first layer,
- a second layer,
- a third layer, and an oxide layer that is formed in the first, second and third layers, in a thickness direction of the substrate, the first layer is arranged below the second layer and above the third layer, Al contents of the second layer and the third layer are smaller than an Al content of the first layer, the Al content of the first layer is a maximum Al content of the current confinement layer, thicknesses of the second layer and the third layer in the thickness direction of the substrate are greater than a thickness of the first layer in the thickness direction of the substrate, the oxide layer extends from a side surface of the mesa post to a tip portion, between the side surface of the mesa post and the tip portion,
- the entire thickness of the first layer is occupied by the oxide layer,
- the entire thickness of the second layer is not occupied by the oxide layer, and
- the entire thickness of the third layer is not occupied by the oxide layer, at least one of
- (a) in the second layer, the oxide layer has a triangular shape with sides formed by the side surface of the mesa post and a bottom surface of the second layer, respectively, and
- (b) in the third layer, the oxide layer has a triangular shape with sides formed by the side surface of the mesa post and an upper surface of the third layer, respectively, and at least one of
- (i) in the thickness direction of the substrate, a maximum thickness of the oxide layer in the second layer is greater than the thickness of the first layer, and
- (ii) in the thickness direction of the substrate, a maximum thickness of the oxide layer in the third layer is greater than the thickness of the first layer, the method comprising:

epitaxially growing the active layer and the third, first and second layers of the current confinement layer above the substrate;

forming the mesa post by etching; and forming the oxide layer by
- heating the mesa post to a prescribed temperature in a water vapor atmosphere, and
- keeping the mesa post at the prescribed temperature for a prescribed time to cause oxidization of the current confinement layer from a side surface of the mesa post.

17. The method according to claim 16, wherein the epitaxially growing includes epitaxially growing, sequentially on the substrate,
    a lower reflective layer,
    an n-type cladding layer,
    a first p-type cladding layer,
    the active layer,
    the third, first and second layers of the current confinement layer,
    a second p-type cladding layer, and
    an upper reflective layer.

18. The method according to claim 16, wherein the epitaxially growing includes epitaxially growing a plurality of AlGaAs layers having different Al composition ratios to form the third, first and second layers of the current confinement layer.

19. The method according to claim 18, wherein the epitaxially growing the plurality of AlGaAs layers includes epitaxially growing, sequentially in the stated order,
    the third layer as an $Al_zGa_{1-z}As$ layer,
    the first layer as an $Al_xGa_{1-x}As$ layer, and
    the second layer as an $Al_yGa_{1-y}As$ layer, where $y<x$ and $z<x$.

20. The method according to claim 18, wherein the epitaxially growing the plurality of AlGaAs layers includes epitaxially growing, sequentially in the stated order,
    the third layer as an $Al_zGa_{1-z}As$ layer,
    the first layer as an $Al_xGa_{1-x}As$ layer,
    a fourth layer as an $Al_aGa_{1-a}As$ layer,
    a fifth layer as an $Al_bGa_{1-b}As$ layer, and
    the second layer as an $Al_yGa_{1-y}As$ layer, where $y<b<a<x$ and $z<x$.

* * * * *